(12) United States Patent
Youn et al.

(10) Patent No.: US 11,107,861 B2
(45) Date of Patent: Aug. 31, 2021

(54) ORGANIC LIGHT EMITTING DIODE DISPLAY

(71) Applicant: LG Display Co., Ltd., Seoul (KR)

(72) Inventors: Woo-Ram Youn, Paju-si (KR);
Ji-Hyang Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 51 days.

(21) Appl. No.: 16/210,358

(22) Filed: Dec. 5, 2018

(65) Prior Publication Data

US 2019/0181188 A1 Jun. 13, 2019

(30) Foreign Application Priority Data

Dec. 8, 2017 (KR) .................. 10-2017-0168166

(51) Int. Cl.
*H01L 27/32* (2006.01)
*H01L 51/52* (2006.01)

(52) U.S. Cl.
CPC ...... *H01L 27/3211* (2013.01); *H01L 27/3206* (2013.01); *H01L 27/3246* (2013.01); *H01L 27/3262* (2013.01); *H01L 51/5218* (2013.01); *H01L 51/5228* (2013.01); *H01L 51/5234* (2013.01); *H01L 51/5253* (2013.01);
(Continued)

(58) Field of Classification Search
CPC ............. H01L 27/3246; H01L 27/3295; H01L 27/3206; H01L 51/5218; H01L 51/5234; H01L 51/5228; H01L 51/5265; H01L 51/5271; H01L 51/5209; H01L 51/5225;
(Continued)

(56) References Cited

U.S. PATENT DOCUMENTS

| 9,111,890 B2 | 8/2015 | Chung et al. |
| 9,478,742 B2 | 10/2016 | Takagi et al. |

(Continued)

FOREIGN PATENT DOCUMENTS

| CN | 102969329 A | 3/2013 |
| CN | 103219355 A | 7/2013 |

(Continued)

OTHER PUBLICATIONS

Search Report dated Nov. 29, 2019 from the Taiwan Intellectual Property Office in a courterpart Taiwanese patent application.

(Continued)

*Primary Examiner* — Yu Chen
(74) *Attorney, Agent, or Firm* — Morgan, Lewis & Bockius LLP

(57) ABSTRACT

An organic light emitting diode display (OLED) is disclosed. The disclosed OLED includes a substrate including a plurality of sub-pixels, each sub-pixel comprising a display area and a non-display area surrounding the display area, the display area comprising a first display area at a center region of the display area and a second display area surrounding the first display area; a first electrode formed in the display area; an organic light emitting layer formed on the first electrode and extending to the non-display area; a third electrode formed on a portion of the organic light emitting layer in the first display area; and a second electrode formed on the third electrode and the organic light emitting layer, wherein the first and third electrodes are able to achieve a micro cavity effect.

17 Claims, 4 Drawing Sheets

(52) U.S. Cl.
CPC ...... *H01L 51/5265* (2013.01); *H01L 51/5209* (2013.01); *H01L 51/5225* (2013.01); *H01L 51/5271* (2013.01); *H01L 2251/5315* (2013.01); *H01L 2251/558* (2013.01)

(58) Field of Classification Search
CPC ............... H01L 27/322; H01L 27/3262; H01L 51/5253; H01L 2251/558
See application file for complete search history.

(56) References Cited

U.S. PATENT DOCUMENTS

| | | | |
|---|---|---|---|
| 2011/0241000 A1 | 10/2011 | Choi et al. | |
| 2012/0001182 A1 | 1/2012 | Choi et al. | |
| 2013/0187131 A1 | 7/2013 | Chung et al. | |
| 2014/0014910 A1 | 1/2014 | Hwang et al. | |
| 2015/0060820 A1* | 3/2015 | Takagi | H01L 51/5218 257/40 |
| 2016/0133681 A1 | 5/2016 | Nam et al. | |
| 2016/0149151 A1* | 5/2016 | Kam | H01L 51/504 257/40 |
| 2016/0172620 A1* | 6/2016 | Hashimoto | H01L 51/5218 257/40 |
| 2016/0248039 A1* | 8/2016 | Choung | H01L 51/5234 |
| 2017/0104036 A1 | 4/2017 | Maeda | |
| 2017/0148860 A1 | 5/2017 | Park et al. | |
| 2018/0151824 A1* | 5/2018 | Park | H01L 27/322 |

FOREIGN PATENT DOCUMENTS

| | | |
|---|---|---|
| CN | 104425766 A | 3/2015 |
| CN | 105633289 A | 6/2016 |
| TW | 201332100 A | 8/2013 |
| TW | 201509225 A1 | 3/2015 |
| TW | 201631756 A | 9/2016 |

OTHER PUBLICATIONS

Combined Search and Examination Report dated May 20, 2019 from the UKIPO in connection with GB1819785.5.
Office Action from the Taiwan Intellectual Property Office dated May 21, 2020 in a corresponding Taiwanese Patent Application No. 107144179.
Office Action from China National Intellectual Property Administration dated Sep. 23, 2020 in a corresponding Chinese Patent Application No. 201811432295.4.
Office Action from Taiwan Intellectual Property Office dated Sep. 29, 2020 in a corresponding Taiwanese Patent Application No. 107144179 (Partial English translation included).

* cited by examiner

ORGANIC LIGHT EMITTING DIODE DISPLAY

The present application claims the priority from and the benefit of Korean Patent Application No. 10-2017-0168166 filed in Republic of Korea on Dec. 8, 2017, which is hereby incorporated by reference in its entirety for all purposes as if fully set forth herein.

BACKGROUND

1. Technical Field

The present disclosure relates to an organic light emitting diode display (OLED), and particularly, to an OLED that can improve a light extraction efficiency.

2. Discussion of the Related Art

With the advent of the information society, information display devices for processing and displaying a large amount of information have been drawing interest, including for application in portable information devices. Accordingly, various types of flat display devices of lightweight and thin profile have been developed and spotlighted.

For example, the types of flat display devices include a liquid crystal display device (LCD), a plasma display panel device (PDP), a field emission display device (FED), an electroluminescent display device (ELD), and an organic light emitting diode display device (OLED). These flat display devices have advantages of thin profile, lightweight, low power consumption, and the like, and therefore have replaced cathode ray tube (CRT) devices rapidly.

Among the flat display devices, the OLED is a self-luminescent device. As such, it can be lightweight and have a thin profile because it does not require a backlight used, for example, for emitting light in the LCD.

Further, compared with the LCD, the OLED has advantages of an excellent viewing angle and contrast ratio, low power consumption, operation in low DC voltage, a fast response speed, being equipped to withstand an external impact because of its solid internal components, and a wide operating temperature range.

In addition, since processes of manufacturing the OLED are relatively simple, a production cost of the OLED can be reduced in comparison with that of the LCD.

FIG. 1 is a band diagram of a light emitting diode of an OLED according to the related art.

As illustrated in FIG. 1, a light emitting diode 10 includes an anode 21, a cathode 25, and an organic light emitting layer between the anode 21 and the cathode 25. The organic light emitting layer includes a hole transport layer (HTL) 33, an electron transport layer (ETL) 35, and an emission material layer (EML) 40.

To improve an emission efficiency, a hole injection layer (HIL) 37 is between the anode 21 and the HTL 33, and an electron injection layer (EIL) 39 is between the cathode 25 and the ETL 35.

In the light emitting diode 10, when the anode 21 and the cathode 25 are respectively applied with a positive voltage and a negative voltage, a hole from the anode 21 and an electron from the cathode 25 are transported to the EML 40 and form an exciton. When a transition of the exciton from an excited state to a ground state occurs, a light is produced and emitted from the EML 40.

However, much of the light emitted from the organic light emitting layer is lost, and a light output from the related art OLED is only about 20% of the total light produced at the organic light emitting layer.

An amount of light emitted from the organic light emitting layer increases according to a magnitude of a current applied to the OLED. Accordingly, a higher current applied to the organic light emitting layer can increase a brightness of the OLED. However, this causes an increase in power consumption and a reduction in lifetime of the OLED.

SUMMARY

Accordingly, the present disclosure is directed to an OLED that substantially obviates one or more of the problems due to limitations and disadvantages of the related art.

An aspect of the present disclosure is to provide an OLED that can improve an extraction efficiency and also improve a color purity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages, and in accordance with the purpose of the present invention, as embodied and broadly described herein, An organic light emitting diode display (OLED) includes: a substrate including a plurality of sub-pixels, each sub-pixel comprising a display area and a non-display area surrounding the display area, the display area comprising a first display area at a center region of the display area and a second display area surrounding the first display area; a first electrode formed in the display area; an organic light emitting layer formed on the first electrode and extending to the non-display area; a third electrode formed on a portion of the organic light emitting layer in the first display area; and a second electrode formed on the third electrode and the organic light emitting layer, wherein the first and third electrodes are able to achieve a micro cavity effect.

In another aspect, an organic light emitting diode display (OLED) includes: a substrate including a plurality of sub-pixels, the sub-pixels including at least a first sub-pixel having a first display region, a second display region, and a non-display region; an overcoat layer on the substrate and including a groove in the first sub-pixel, the groove having a bottom surface in the first display region and an inclined side wall in the second display region; a first electrode on the bottom surface and the inclined side wall of the groove; an organic light emitting layer on the first electrode; a second electrode on the organic light emitting layer; and a third electrode between the organic light emitting layer and the second electrode, and contacting the second electrode.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

Figure 1:
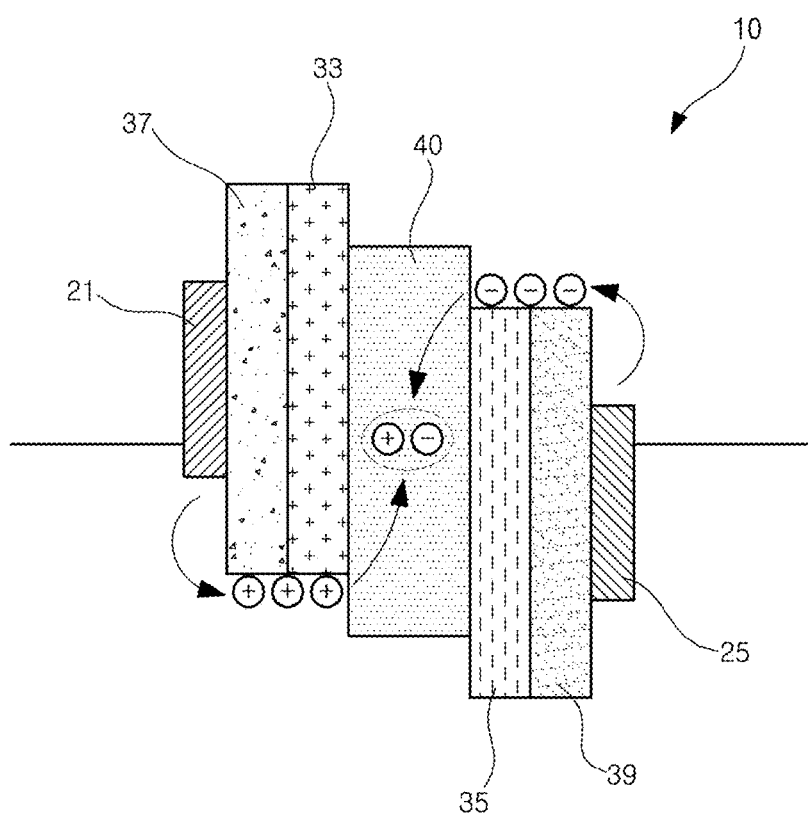
FIG. 1 is a band diagram of a light emitting diode of an OLED according to the related art.
Figure 2:
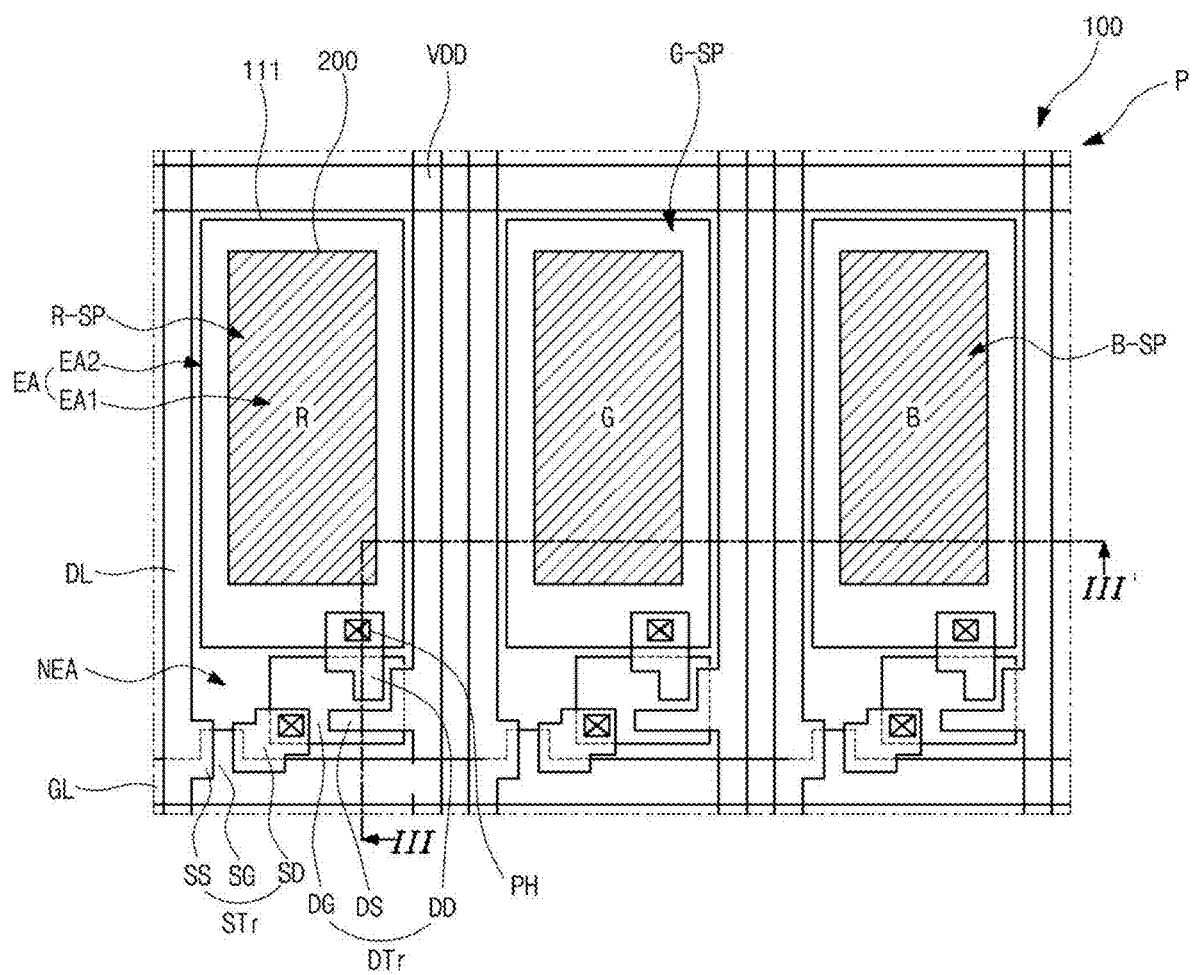
FIG. 2 is a plan view illustrating a structure of a unit pixel including three sub-pixels in an OLED according to an example embodiment of the present disclosure.
Figure 3:
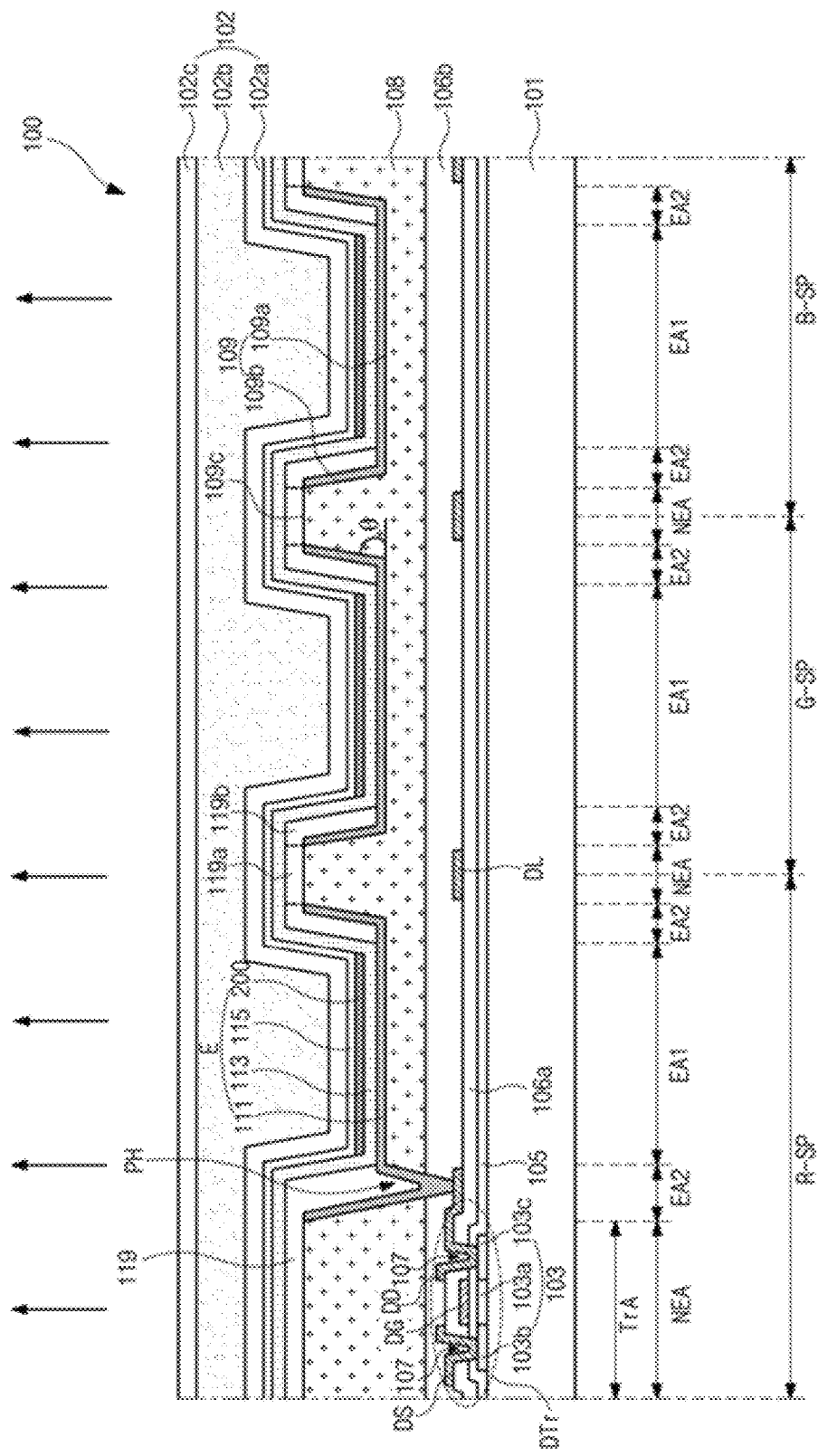
FIG. 3 is a cross-sectional view taken along a line of FIG. 2.

FIG. 2 is a plan view illustrating a structure of a unit pixel including three sub-pixels in an OLED according to an example embodiment of the present invention. FIG. 3 is a cross-sectional view taken along a line of FIG. 2.

The OLED 100 of this example embodiment may be a top emission type display or bottom emission type display according to a transmission direction (or output direction) of an emitted light. In this aspect, a top emission type light emitting display device 10 is described by way of example.

As illustrated in FIGS. 2 and 3, a unit pixel P of the OLED 100 may include three sub-pixels R-SP, G-SP, and B-SP. Each sub-pixel may include a display region (or emission region) EA, and a bank 119 may be located along a peripheral portion of the display region EA. A non-display region (or non-emission region) NEA may be defined at the bank 119.

For the purpose of the description of an example embodiment, example sub-pixels R-SP, G-SP, and B-SP arranged with the same width are shown. However, the sub-pixels R-SP, G-SP, and B-SP may have different configurations with different widths.

A switching thin film transistor (TFT) STr and a driving TFT DTr may be formed at the non-display region NEA of each sub-pixel. At the display region EA of each sub-pixel, a light emitting diode E including a first electrode 111, an organic light emitting layer 113, and a second electrode 115 may be formed.

The switching TFT STr and the driving TFT DTr may be connected to each other, and the driving TFT DTr may be connected to the light emitting diode E.

Also, a gate line SL, a data line DL, and a power line VDD may be arranged on a substrate 101 to define each of the sub-pixels R-SP, G-SP, and B-SP.

The switching TFT STr may be formed at the crossing portion of the corresponding gate line GL and the corresponding data line DL, and may function to select the corresponding sub-pixel.

The switching TFT STr may include a gate electrode SG branching off from the gate line SL, a semiconductor layer, a source electrode SS, and a drain electrode SD.

The driving TFT DTr may function to operate the light emitting diode E of the sub-pixel selected by the corresponding switching TFT STr. The driving TFT DTr may include a gate electrode DG connected to the drain electrode SD of the switching TFT STr, a semiconductor layer 103, a source electrode DS connected to the power line VDD, and a drain electrode DD.

The drain electrode DD of the driving TFT DTr may be connected to the first electrode 111 of the light emitting diode E, and the organic light emitting layer 113 may be interposed between the first and second electrodes 111 and 115.

In the OLED 100 of this example embodiment, the display region EA in each sub-pixel may be divided into a first display region EA1 and a second display region EA2 adjacent a peripheral portion of the first display region EA1. In other words, the second display region EA2 may be located next to the first display region EA1 or surround the first display region EA1.

Further, the OLED 100 of this example embodiment may further include a third electrode 200 that corresponds to the first display region EA1 and is connected to the second electrode 115.

As further illustrated in FIG. 3, in the example OLED 100, the substrate 101 having the driving TFT DTr and the light emitting diode E may be encapsulated by a protective film 102.

The semiconductor layer 103 may be located at a switching region TrA where the driving TFT DTr is formed. The semiconductor layer 103 may be made of silicon, and may include an active region 103a as a channel at a center portion thereof, and source and drain regions 103b and 103c, highly doped with impurities, at both sides of the active region 103a.

A gate insulating layer 105 may be formed on the semiconductor layer 103.

The gate electrode DG may be formed on the gate insulating layer 105 corresponding to the active region 103a. The gate line GL extending along a direction may be formed on the gate insulating layer 103.

A first inter-layered insulating layer 106a may be located on the gate electrode DG and the gate line GL. The first inter-layered insulating layer 106a and the gate insulating layer 105 may include first and second semiconductor contact holes 107 exposing the source and drain regions 103b and 103c, respectively.

The source and drain electrodes DS and DD may be formed on the first inter-layered insulating layer 106a and spaced apart from each other. The source and drain electrodes DS and DD may contact the source and drain regions 103b and 103c through the first and second semiconductor contact holes 107, respectively.

A second inter-layered insulating layer 106b may be formed on the source and drain electrodes DS and DD, and the first inter-layered insulating layer 106a.

The source and drain electrodes DS and DD, the semiconductor layer 103, and the gate electrode DG, and the gate insulating layer 105 on the semiconductor layer 103 may form the driving TFT DTr.

Even though not shown in FIG. 3, the switching TFT STr may have substantially the same structure as the driving TFT DTr.

In this example embodiment, the driving TFT DTr and the switching TFT STr having a top gate structure with the semiconductor layer 103 formed as a polycrystalline silicon layer or oxide semiconductor layer is described by way of example. Alternatively, one or both of the driving TFT DTr and the switching TFT STr may have a bottom gate structure with the semiconductor layer 103 formed as an amorphous silicon layer.

If the semiconductor layer 103 uses an oxide semiconductor layer, a light shielding layer may be formed below the semiconductor layer 103, and a buffer layer may be formed between the light shielding layer and the semiconductor layer 103.

An overcoat layer 108 may be formed on the second inter-layered insulating layer 106b. The overcoat layer 108 and the second inter-layered insulating layer 106b may have a drain contact hole PH exposing the drain electrode DD of the driving TFT DTr.

The overcoat layer 108 may include a groove 109 corresponding to the display region EA of each sub-pixel, and the groove 109 may be located at a side of the drain contact hole PH. Accordingly, the overcoat layer 108 may include the groove 109, which has a flat bottom surface 109a and a side wall (or side surface) 109b inclined at a predetermined angle θ from an edge of the bottom surface 109a, and a top surface 109c between the neighboring grooves 109. The first display region EA1 of each sub-pixel may correspond to the bottom surface 109a of the groove 109, and the second display region EA2 of each sub-pixel may correspond to the side wall 109b of the groove 109.

The top surface 109c of the overcoat layer 109 may be located corresponding to the non-display region NEA.

The inclined angle θ of the side wall 109b may be in a range of about 10 degrees to about 80 degrees. The inclined angle θ may vary according to an area of each sub-pixel, within a limit such that a light output from the side wall 109b (i.e., output from the second display region EA2) is heading for a center portion of the corresponding sub-pixel.

At the groove 109, the first electrode 111, which may be made of a material having a relatively high work function and serve as an anode of the light emitting diode E of each sub-pixel, may be formed. Each first electrode 111 may be patterned by each sub-pixel and be formed in each sub-pixel. The first electrode 111 may be connected to the drain electrode DD of the driving TFT DTr through the drain contact hole PH and may extend over the bottom surface 109a and the side wall 109b of the groove 109.

In other words, each first electrode 111 may be located at the groove 109 of the overcoat layer 108 corresponding to each sub-pixel, and may be separated from the first electrode 111 of a neighboring sub-pixel. The first electrode 111 of the sub-pixel may be formed to extend along both of the first display region EA1 and the second display region EA2, without being formed on the top surface 109c of the overcoat layer 108 corresponding to the non-display region NEA. The bank 119 may be formed along a peripheral portion of the first electrode 111. The bank 119 may be located between the neighboring first electrodes 111 and may separate the neighboring first electrodes 111 from each other.

The bank 119 may be made of a transparent insulating material having a refractive index of about 1.5. For example, the bank 119 may be made of, but is not limited to, an acryl based resin, an epoxy resin, a phenol resin, a polyamide based resin, a polyimide based resin, an unsaturated polyester based resin, a polyphenylene based resin, a polyphenylene sulfide based resin, a benzocyclobutene, or a photoresist.

The bank 119 may be divided into a first bank 119a in the non-display region NEA, and a second bank 119b in the second display region EA2. The first bank 119a in the non-display region NEA may have a structure to separate the first electrodes 111 of neighboring sub-pixels from one another. The second bank 119b may cover and shield a portion of the first electrode 111 extending along the side wall 109b of the overcoat layer 108 in the second display region EA2. The organic light emitting layer 113 may be formed on the first and second banks 119a and 119b, and on the first electrode 111. The second electrode 115 may be formed entirely on the organic light emitting layer 113 and serve as a cathode.

When the first electrode 111 and the second electrode 115 are applied with respective voltages, a hole from the first electrode 111 and an electron from the second electrode 115 may be transported to the organic light emitting layer 113 and form an exciton. When a transition of the exciton from an excited state to a ground state happens, a light may be produced and emitted.

The emitted light may pass though the transparent second electrode 115 and travel to the outside, and thus the OLED 100 may display an image.

The red, green, and blue sub-pixels R-SP, G-PS, and B-SP may include red, green and blue organic light emitting layers 113, respectively, to emit red, green, and blue lights. Thus, a full color image of high brightness may be achieved.

A capping layer (not shown) may be formed on the second electrode 115. The capping layer may be made of an organic material having a refractive index of about 1.8 or greater, and may be made of an organic material having a refractive index that matches a refractive index of the organic light emitting layer 113. The capping layer may be omitted.

The protective film 102 may be formed on the second electrode 115 and serve to prevent or reduce external oxygen or moisture from permeating the organic light emitting layer 113 and the second electrode 115. The protective film 102 may include at least one organic layer and at least one inorganic layer. In FIG. 3, the protective film 102 including a first inorganic layer 102a, an organic layer 102b, and a second inorganic layer 102c is shown by way of example, but it is not limited to this example structure.

The first inorganic layer 102a may be formed on the second electrode 115 to cover the second electrode 115. The organic layer 102b may be formed on the first inorganic layer to prevent or reduce particles passing through the first inorganic layer 102a and permeating the organic light emitting layer 113 and the second electrode 115. The second inorganic layer 102c may be formed on the organic layer 102b to cover the organic layer 102b.

The first and second inorganic layers 102a and 102c may be made of silicon nitride, aluminum nitride, zirconium nitride, titanium nitride, hafnium nitride, tantalum nitride, silicon oxide, aluminum oxide, or titanium oxide.

The organic layer 102b may be transparent to transmit the light emitted from the organic light emitting layer 113. The organic layer 102b may be made of an organic material to transmit 99% or greater of the light from the organic light emitting layer 113.

The organic layer 102b may be formed to fill a space between the banks 119 to planarize a step between the display region EA and the non-display region NEA that is produced by the groove 109 of the overcoat layer 108.

The organic layer 102b may be made of an organic material having a refractive index of about 1.8 or greater, and may be made of an organic material having a refractive index that matches a refractive index of the organic light emitting layer 113. In that regard, the organic layer 102b may include one or more of a vinyl compound, a photopolymerization initiator, toluene, and 2,6-di-tert-butyl-4-methylphenol. In this case, the vinyl compound may be a phenyl sulfide.

Accordingly, the OLED 100 according to the example embodiment can prevent or reduce permeation of external moisture and oxygen thereinto.

The OLED 100 according to the example embodiment may further include the third electrode 200 between the organic light emitting layer 113 and the second electrode 115 at the display region EA of each sub-pixel.

In other words, the third electrode 200 may be located to correspond to the bottom surface 109a of the groove 109 of the overcoat layer 108 in each sub-pixel and thus to correspond to the first display area EA1 of each sub-pixel.

Even though the second electrode 115 is made of a transparent metal material, the OLED 100 can achieve a micro cavity effect through the first display region EA1 because of the third electrode 200. Thus, a light extraction efficiency of the OLED 100 can be improved.

Moreover, through the second display region EA2, a light of a wave guide mode can be extracted to the outside. Thus, the light extraction efficiency of the OLED 100 can be further improved.

In addition, a light traveling to the non-display region NEA can be reflected and then extracted to the outside. Thus, the light extraction efficiency of the OLED 100 can be even further improved. Moreover, a light leakage produced by reflection from the neighboring sub-pixels can be minimized.

Figure 4:
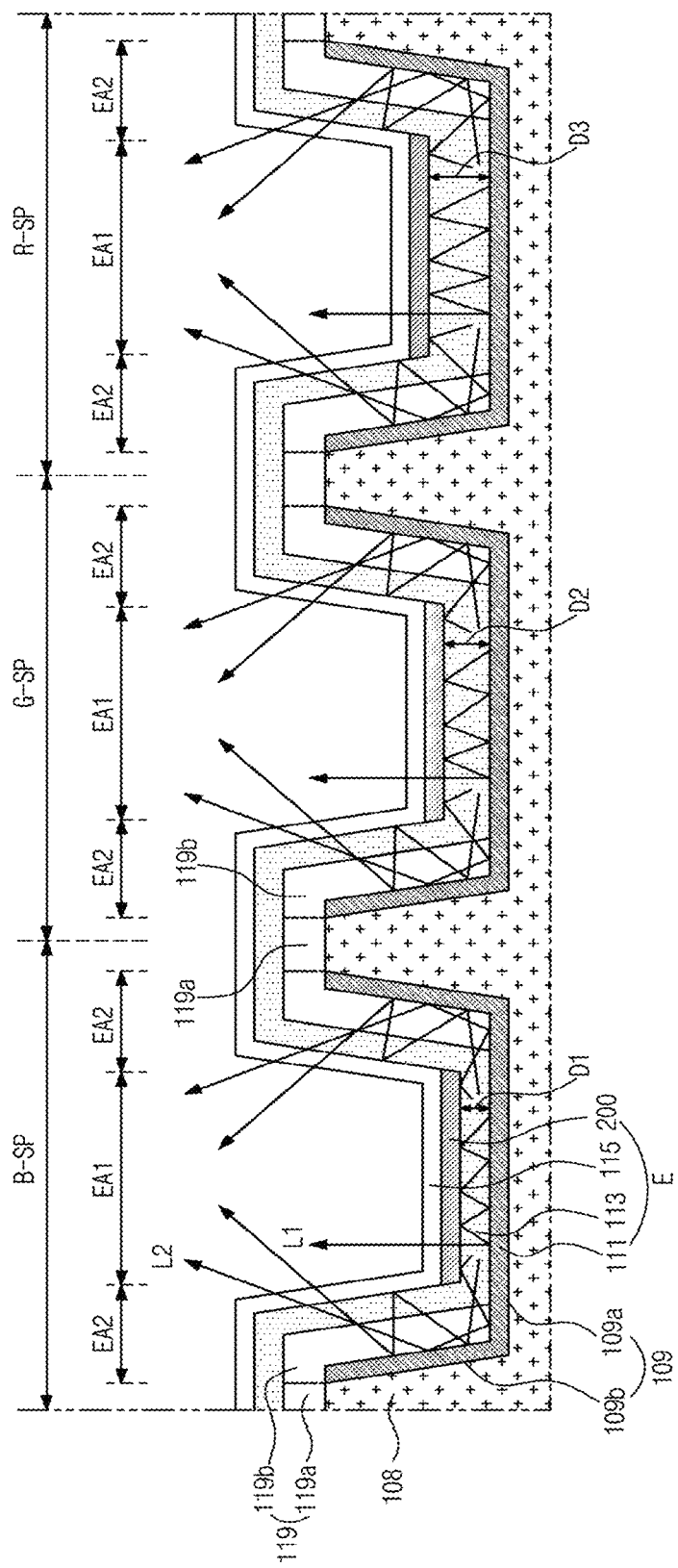
FIG. 4 is a schematic view illustrating various example light paths guided in an OLED according to an example embodiment of the present disclosure.

FIG. 4 is a schematic view illustrating various example light paths guided in an OLED according to an example embodiment of the present disclosure.

As further illustrated in FIG. 4, the red, green, and blue sub-pixels R-SP, G-SP, and B-SP may form one unit pixel P (see, e.g., FIG. 3). The light emitting diode E including the first electrode 111, the organic light emitting layer 113, and the second electrode 115 may be located in each sub-pixel.

In the overcoat layer 108, the groove 109 including the bottom surface 109a corresponding to the first display region EA1 and the inclined side wall 109b may be formed. The first electrode 111 may extend along the bottom surface 109a and the side wall 109b of the groove 109, and may be located over the entire first and second display regions EA1 and EA2.

In other words, the first electrodes 111 may be located at the respective grooves 109 of the overcoat layer 108 in the respective sub-pixels and may be configured to be separated from one another. The first electrode 111 may extend and be located entirely over the first and second display regions EA1 and EA2, without being formed on the top surface 109c of the overcoat layer 108 corresponding to the non-display region NEA.

The bank 119 may be located along a peripheral portion of the first electrode 111. The first bank 119a may be located in the non-display region NEA and separate the first electrodes 111 of neighboring sub-pixels from one another. The second bank 119b may cover and shield the portion of the first electrode 111 extending along the side wall 109b of the groove 109.

The organic light emitting layers 113 emitting red, green, and blue lights may be located at the red, green, and blue sub-pixels R-SP, G-SP, and B-SP, respectively, on the substrate having the first electrode 111 and the bank 119. The second electrode 115 may be located on the organic light emitting layers 113.

The organic light emitting layer 113 located at each sub-pixel may be configured with a single layer of an emission material. Alternatively, to increase an emission efficiency, the organic light emitting layer 113 may be configured with multiple layers that include, without limitation, a hole injection layer, a hole transport layer, an emission material layer, an electron transport layer, and an electron injection layer.

The third electrode 200 may be located between the organic light emitting layer 113 and the second electrode 115, and be located only in the first display region EA1.

The first electrode 111 may include a metal material having a high reflectance, such as a stacked structure with Al and Ti (e.g., Ti/Al/Ti), a stacked structure with Al and ITO (e.g., ITO/Al/ITO), an APC (Ag/Pd/Cu) alloy, or a stacked structure with APC alloy and ITO (e.g., ITO/APC/ITO), to achieve a micro cavity effect.

The second electrode 115 may be made of a transparent conductive material (TCO), such as ITO, IZO, or the like.

The third electrode 200 may be made of a semi-transmissive conductive material, such as Mg, Ag, or an alloy of Mg and Ag.

Accordingly, in the OLED 100 according to an example embodiment, a micro cavity effect between the first electrode 111 and the third electrode 200 can be configured.

A specific wavelength may be enhanced by the micro cavity effect. Thus, a color purity and emission efficiency of the OLED 100 can be improved.

In this regard, respective thicknesses D1, D2, and D3 of the organic light emitting layers 113 of the blue, green, and red sub-pixels B-SP, G-SP and R-PS may be different from one another. In other words, to achieve micro cavity effects suitable for the respective sub-pixels B-SP, G-SP, and R-SP, the respective organic light emitting layers 113 of the sub-pixels B-SP, G-SP, and R-SP may be individually configured at different thicknesses D1, D2, and D3.

Since wavelengths of lights respectively from the blue, green, and red sub-pixels B-SP, G-SP, and R-SP are different from one another, resonance distances to achieve micro cavity effects at the respective sub-pixels B-SP, G-SP, and R-SP may be set according to respective wavelengths of lights from the sub-pixels B-SP, G-SP, and R-SP.

The resonance distance may be set to a value that is an integer multiple of a half of a wavelength of a light from the corresponding sub-pixel. Since a red light, a green light, and a blue light have different wavelengths, the red, green, and blue sub-pixels R-SP, G-SP, and B-SP may require different resonance distances.

For example, since a wavelength of the red light is about 620 nm, a resonance distance of the red sub-pixel R-SP may require an integer multiple of about 310 nm (that is 620 nm/2). Thus, the thickness D3 of the organic light emitting layer 113 of the red sub-pixel R-PS may be set as an integer multiple of about 310 nm.

Further, since a wavelength of the green light is about 530 nm, a resonance distance of the green sub-pixel G-SP may require an integer multiple of about 265 nm (that is 530 nm/2). Thus, the thickness D2 of the organic light emitting layer 113 of the green sub-pixel G-SP may be set as an integer multiple of about 265 nm. In addition, since a wavelength of the blue light is about 460 nm, a resonance distance of the blue sub-pixel B-SP may require an integer multiple of about 230 nm (that is 460 nm/2). Thus, the thickness D1 of the organic light emitting layer 113 of the blue sub-pixel B-PS may be set as an integer multiple of about 230 nm.

As such, by employing the third electrode 200 that is made of a semi-transmissive material and contacts the second electrode 115 at the first display region EA1, a micro cavity effect can be configured even when using the second electrode 115 of a transparent metal material. Accordingly, a light extraction efficiency and color purity of the OLED 100 can be improved.

Further, through the third electrode 200, a voltage drop of the second electrode 115 can be prevented or suppressed.

In this regard, the second electrode 115 made of a transparent metal material may have a poor film quality and a high specific resistivity. Thus, a voltage applied to the sub-pixels may not be uniform at positions of the sub-pixels. Rather, an IR voltage drop may cause a difference between a voltage applied at a region close to a voltage supply portion and a voltage applied to a region far from the voltage supply portion. This difference may cause an unbalance of brightness or display quality, and may further cause an increase in power consumption.

However, in this example embodiment, the third electrode 200 is formed in each sub-pixel and is in contact with the second electrode 115. Thus, an IR drop by the second electrode 115 can be mitigated or prevented.

The OLED 100 applied with the micro cavity configuration may increase in front brightness. Thus, an emission efficiency can be improved, and power consumption and device lifetime can be improved accordingly. However, since a front brightness and a viewing angle may be in inverse proportion to each other, an increase in the front brightness may cause a reduction in a side brightness.

Further, for each sub-pixel of the OLED 100 with the micro cavity, there may be a difference between a distance traveled by a light output to the front and a distance traveled by a light output to a side. Thus, a color shift according to a viewing angle may occur.

In this example embodiment, a light of a wave guide mode is extracted to the outside through the second display region EA2. Thus a side brightness can increase, and a color shift according to a viewing angle can be prevented or mitigated.

In this regard, a light of a surface plasmon mode and a light of a light guide mode may make up about 60% to about 70% of the total light produced by the organic light emitting layer 113. The light of the surface plasmon mode may be produced at an interface between the organic light emitting layer 113 and metal layers, i.e., the first and second electrodes 111 and 115. The light of the light guide mode may be produced by the organic light emitting layer 113 interposed between the two reflection layers, i.e., the first and third electrodes 111 and 200.

In other words, about 60% to about 70% of the total amount of light produced by the organic light emitting layer 113 may be trapped in the light emitting diode E.

In this example embodiment, the light of the wave guide mode trapped in the light emitting diode E may be extracted through the second display region EA2. Thus, a light extraction efficiency at a side can be further improved.

TABLE 1

|  | Sample 1 | Sample 2 | Sample 3 |
| --- | --- | --- | --- |
| Amount of light of surface plasmon mode (%) | 30% | 11% | 23% |
| Amount of light of wave guide mode (%) | 40% | 61% | 49% |
| Absorption ratio at organic light emitting layer (%) | 1~3% | 1~3% | 1~3% |
| Output ratio to outside of second electrode (%) | 27% | 25% | 25% |

As shown in Table 1, Sample 1 has a configuration of a light emitting diode of a general OLED, and in this case, an amount of light of a surface plasmon mode is relatively large at about 30%.

Sample 2 and Sample 3 each have a configuration of a light emitting diode of an OLED according to an example embodiment of the present disclosure. Samples 2 and 3 have organic light emitting layers 113 different in thickness. In other words, in each of Samples 2 and 3, the third electrode 200 electrically connected to the second electrode 115 is formed at the first display region EA1 corresponding to the bottom surface 109a of the groove 109, and the first electrode 111 extends over the second display region EA2 corresponding to the side wall 109b of the groove 109.

For Samples 2 and 3, an amount of light of a surface plasmon mode is reduced compared with Sample 1, and an amount of light of a wave guide mode is increased compared with the Sample 1. As such, in this example embodiment with an increase in the amount of light of the wave guide mode, the light of the wave guide mode is extracted through the second display region EA2. Thus, a light extraction efficiency at a side can be further improved.

In other words, in the OLED 100 of this example embodiment, the third electrode 200 of a semi-transmissive material is formed only at the first display region EA1 corresponding to the bottom surface 109a of the groove 109 of the overcoat layer 108, and the side wall 109b of the groove 109 is inclined so that the second display region EA2 is further defined. A portion of the light produced by the organic light emitting layer 113 of the first display region EA1 is the light of the wave guide mode trapped in the light emitting element E. This trapped light of the wave guide mode is reflected by the first electrode 111 at the inclined side wall 109b and is extracted out of the second electrode 115 through the second display region EA2.

In this regard, an amount of light extracted to the outside through the second display region EA2 increases compared with an amount of light of a wave guide mode of the example OLED of Sample 1. Thus, the OLED according to an example embodiment of this disclosure can further improve the light extraction efficiency at a side.

As a result, the OLED 100 of this example embodiment can achieve a micro cavity effect through the first display region EA1 to improve the light extraction efficiency and color purity at the front, and can also extract a light of the wave guide mode to the outside through the second display region EA2 to improve a brightness at a side and further improve the light extraction efficiency accordingly.

Also, by improving a side brightness through the second display region EA2, a color shift according to a viewing angle can be prevented or mitigated.

Further, by forming the second display region EA2, a light heading from the first and second display regions EA1 and EA2 to the non-display region NEA can also be extracted out of the second electrode 115, and a light leakage by reflection from the neighboring sub-pixels can be prevented or reduced.

Regarding the light leakage, a light of a wave guide mode out of the light emitted from the organic light emitting layer 113 may propagate in a wave guide mode with some total reflections and then reach a neighboring sub pixel, thereby causing a light leakage.

For example, a light from the organic light emitting layer 113 of the red sub-pixel R-SP may be propagated into the green sub-pixel G-SP. Then, a red light leakage can happen at the green sub-pixel G-SP.

However, in the OLED 100 of this example embodiment, the groove 109 including the side wall 109b may be formed in the overcoat layer 108, and the first electrode 111 may extend over the side wall 109b. Accordingly, a light from the organic light emitting layer 113 reaching a neighboring sub-pixel can be prevented or reduced.

Thus, a light leakage by reflection from neighboring sub-pixels can be minimized.

In an example case in which the third electrode 200 is formed to extend over the second display region EA2, an emission efficiency does not increase significantly from that of a general OLED (e.g., Sample 1), as shown below in Table 2.

TABLE 2

|  | Sample 1 | | | Sample 4 | | |
| --- | --- | --- | --- | --- | --- | --- |
|  | R-SP | G-SP | B-SP | R-SP | G-SP | B-SP |
| Emission efficiency | 39.23% | 77.48% | 3.48% | 39.37% | 81.57% | 3.46% |

Sample 1 has a configuration of a light emitting diode of a general OLED. Sample 4 has a configuration of a light emitting diode of an OLED where the third electrode 200 extends over the second display region EA2. Sample 4 merely has about 5% increase of an emission efficiency of the green sub-pixel G-SP compared with the sample 1, and is approximately equal in overall emission efficiency to the sample 1.

This is because, even though the first and second display regions EA1 and EA2 are defined by the groove 109, a light of a wave guide mode may still exist in the second display region EA2 due to a high reflectance of the third electrode 200 of a semi-transmissive material.

Further, in an example case in which the bank 119 does not cover the first electrode 111 on the second display region EA2, a light may be produced at the second display region EA2 by a voltage difference between the first and second electrodes 111 and 115. If this happens, little to no light may be produced at the first display region EA1 such that an emission efficiency may be further reduced.

In other words, since the organic light emitting layer 113 of the second display region EA2 is formed at the inclined side wall 109b of the groove 109, the organic light emitting layer 113 at the side wall 109b may have a thickness smaller than that of the organic light emitting layer 113 at the bottom surface 109a.

Accordingly, in an example case where voltages are applied to the first and second electrodes at both of the first and second display regions EA1 and EA2, an electric field may be mostly concentrated on the organic light emitting layer 113 of the smaller thickness located at the second display region EA2 to form an exciton. Thus, most of the light may be produced from the second display region EA2.

Thus, in order to prevent or suppress a light being produced at the second display region EA2, the bank 119 may cover the first electrode 111 at the second display region EA2 to insulate the first electrode 111 there.

As described above, in the OLED of this example embodiment, the groove 109 may be formed in the overcoat layer 108 and may include the bottom surface 109a and the inclined side wall 109b, the first electrode 111 may be formed to correspond to the groove 109, and the third electrode 200 made of a semi-transmissive material may be formed at the first display region EA1 corresponding to the bottom surface 109a of the groove 109 and be electrically connected to the transparent second electrode 115.

Therefore, a micro cavity effect can be achieved through the first display region EA1 to improve the light extraction efficiency and color purity at the front. Further, a light of a wave guide mode can be extracted to the outside through the second display region EA2 corresponding to the side wall 109b of the groove 109 to improve the brightness at a side and thus further improve the light extraction efficiency.

Accordingly, a color shift according to a viewing angle can be prevented or mitigated, and a voltage drop of the second electrode 115 can be prevented or suppressed by the third electrode 200.

Further, a light leakage by reflection from a neighboring sub-pixel can be prevented or mitigated.

It will be apparent to those skilled in the art that various modifications and variations can be made in the OLED of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display, comprising:
   a substrate including a plurality of sub-pixels, each sub-pixel comprising a display area and a non-display area surrounding the display area, the display area comprising a first display area at a center region of the display area and a second display area surrounding the first display area;
   a first electrode formed in the display area;
   an organic light emitting layer formed on the first electrode and extending to the non-display area;
   a third electrode formed on a portion of the organic light emitting layer in the first display area; and
   a second electrode formed on the third electrode and the organic light emitting layer,
   wherein the first and third electrodes are able to achieve a micro cavity effect,
   wherein the third electrode of at least one of the sub-pixels is separated from the third electrode of another of the sub-pixels neighboring the at least one of the sub-pixels,
   wherein a width of the first electrode is larger than a width of the third electrode, and
   wherein side surfaces at opposite edges of the third electrode contact the organic light emitting layer.

2. The organic light emitting diode display according to claim 1, further comprising:
   an overcoat layer formed between the substrate and the first electrode and including a top surface and a groove corresponding to the display area, wherein the groove includes a bottom surface corresponding to the first display area and a side wall of the groove corresponding to the second display area; and
   a bank formed on the top surface of the overcoat layer and a portion of the first electrode formed on the side wall of the groove,
   wherein the organic light emitting layer is formed on the bank and the first electrode.

3. The organic light emitting diode display according to claim 2, wherein the bank is made of a transparent insulating material having a refractive index of 1.5.

4. The organic light emitting diode display according to claim 2, wherein an inclined angle of the side wall of the groove is in a range of 10 degrees to 80 degrees.

5. The organic light emitting diode display according to claim 2, wherein the portion of the first electrode is on the side wall of the groove having an inclined angle.

6. The organic light emitting diode display according to claim 2, wherein a width of the groove is larger than the width of the third electrode.

7. The organic light emitting diode display according to claim 1, wherein the first electrode is made of a metal material having a high reflectance, the second electrode is made of a transparent conductive material, and the third electrode is made of a semi-transmissive conductive material.

8. The organic light emitting diode display according to claim 7, wherein the first electrode has a stacked structure with Al and Ti, a stacked structure with Al and ITO, a stacked structure with Ag, Pd and Cu alloy, or a stacked structure with Ag, Pd and Cu alloy and ITO, the second electrode is made of ITO or IZO, and the third electrode is made of Mg, Ag, or an alloy of Mg and Ag.

9. The organic light emitting diode display according to claim 1, wherein the plurality of sub-pixels includes a red sub-pixel, a green sub-pixel and a blue sub-pixel, wherein a depth of the organic light emitting layer of the red sub-pixel is an integral multiple of a half of the wavelength of red light, a depth of the organic light emitting layer of the greed sub-pixel is an integral multiple of a half of the wavelength of green light, and a depth of the organic light emitting layer of the blue sub-pixel is an integral multiple of a half of the wavelength of blue light.

10. The organic light emitting diode display according to claim 1, wherein each pixel includes a driving TFT, wherein the driving TFT comprises: a semiconductor layer including a source region, a drain region and an active region between the source region and the drain region; a gate insulating layer formed on the semiconductor layer; a gate electrode formed on a portion of the gate insulating layer corresponding to the active layer; and source and drain electrodes respectively formed on the source and drain regions, wherein the drain electrode is connected to the first electrode.

11. The organic light emitting diode display according to claim 1, further comprising:
a protective film formed on the second electrode to cover the second electrode.

12. The organic light emitting diode display according to claim 1, wherein the organic light emitting diode display is a top emission type display or bottom emission type display.

13. The organic light emitting diode display according to claim 1, wherein the second electrode contacts the organic light emitting layer in the second display area.

14. The organic light emitting diode display according to claim 1, wherein the third electrode in each of the sub-pixels is separated from the third electrode of a respective neighboring one of the sub-pixels.

15. The organic light emitting diode display according to claim 1, wherein the second display area of the at least one of the sub-pixels is disposed between the third electrode of the at least one of the sub-pixels and the third electrode of the another of the sub-pixels neighboring the at least one of the sub-pixels.

16. The organic light emitting diode display according to claim 1, wherein the opposite edges of the third electrode are disposed between opposite edges of the first electrode.

17. The organic light emitting diode display according to claim 1, wherein the third electrode is located only in the first display area.

* * * * *